United States Patent [19]

Sproul et al.

[11] Patent Number: 4,682,128
[45] Date of Patent: Jul. 21, 1987

[54] PHASE SHIFTER

[76] Inventors: Robert W. Sproul, 309 Parkside Rd., Harrington Park, N.J. 07640; Michael F. Ponzo, 417 Marven Ave., Hackensack, N.J. 07601

[21] Appl. No.: 820,998

[22] Filed: Jan. 22, 1986

[51] Int. Cl.$^4$ ............... H03H 7/20; H01P 1/18
[52] U.S. Cl. ............... 333/139; 333/101; 333/103; 333/156
[58] Field of Search ............... 333/156, 157, 158, 161, 333/164, 138–140, 1, 101, 103–105, 109, 117–123, 106–108, 245, 248; 342/354, 368–371; 343/777, 778, 816, 853

[56] References Cited

U.S. PATENT DOCUMENTS

| | | | |
|---|---|---|---|
| 3,258,721 | 6/1966 | Russa et al. | 333/120 |
| 3,400,342 | 9/1968 | Putnam | 333/161 |
| 3,571,765 | 3/1971 | Friedman | 333/103 X |
| 3,691,485 | 9/1972 | Beck | 333/123 |
| 3,781,722 | 12/1973 | Person | 333/156 |
| 3,869,585 | 3/1975 | Snyder | 179/173 |
| 3,882,431 | 5/1975 | Hopwood et al. | 333/31 |
| 4,006,418 | 2/1977 | Liskov et al. | 325/163 |
| 4,144,501 | 3/1979 | Togawa et al. | 329/118 |
| 4,161,705 | 5/1979 | Nemit et al. | 333/156 |
| 4,166,999 | 9/1979 | Brady, III | 367/105 |
| 4,190,815 | 2/1980 | Albanese | 333/101 |

OTHER PUBLICATIONS

Chapter 12, Radar Handbook; by Louis Stark, R. W. Burns and W. D. Clark (McGraw–Hill Book Company, 1970).
Microwaves & RF; The Working Man's Phase Shift Primer: Robert Sproul (Nov. 1984).
Lorch Electronics Corp. Catalog No. QJ-719, Quadrature Hybrid (Copr. 1984).

Primary Examiner—Marvin L. Nussbaum
Attorney, Agent, or Firm—Fay, Sharpe, Beall, Fagan, Minnich & McKee

[57] ABSTRACT

A phase shifter with a phase shift primarily independent of frequency includes first and second quadrature hybrids, a delay and a ganged switch. A first path includes an input into the delay, the delay output being connected into the first quadrature hybrid. The corresponding isolated terminal of the first quadrature hybrid forms the output of the first path. A second path includes an input to the second hybrid quadrature with a terminal thereof as an output. Two remaining terminals of the second quadrature hybrid are taken to a common ground through two capacitors of preselected value. The ganged switch selectively engages a system input to either the inputs of the first path or the second path and simultaneously engages a system output to the outputs of the first path or the second path.

20 Claims, 6 Drawing Figures

PHASE SHIFTER

BACKGROUND OF THE INVENTION

This application pertains to the art of electronic phase shifters and, more particularly, to digitally controlled phase shifters.

The most commonly used shifter and the most easily understood is the time shifter used in antenna-beam-forming networks. When a plurality of antennas are placed in a linear array, a radio frequency (RF) signal may reach each of the antennas in the array at a different time. That is to say, an RF wave front arriving at right angles to the line of the array would excite all antennas together, and the signals in the antenna feeds would be in phase and ready to be added as such at a receiver installation. On the other hand, a wave front arriving at a significant angle would result in different phases at the antenna outputs. Judicious placement of delay lines, in proportion to the delays encountered at the antenna itself permits the signals in the feed lines to be re-aligned in phase and time. Adjustment of the feed line delay values permits the array to be steered as if the physical structure itself were rotated.

Application of a true phase shifter is a more subtle matter. One example is a receiver-combiner system, in which multiple diversity inputs are presented to circuits that must combine them coherently in both the time and the frequency domains. If the incoming signals are merely delayed in time, as in the antenna array above, a simple time shifter could be used to align the signals in phase and in time. However, the incoming signals may have been delayed in a more complex manner. For example, two separate signals, each composed of a burst of RF, may have the same starting time but after allowing a time to pass and permitting transient effects to die out, the steady-state RF phase within the otherwise identical envelopes varies from one signal to the other. If a time shifter were used to attempt to remove the difference, the delay introduced would shift the pulse envelope as well. In that this would not be desirable, the RF phase of the signal should be changed without varying the envelope by using a true phase shifter, which can vary the phase without disturbing the time delay.

A typical phase shifter comprises a quadrature hybrid circuit having one lead thereof as the phase shifter input, an output isolated from the input and two quadrature hybrid inputs connected to ground through separate, reactive components such as capacitors or inductors.

Performance in such phase shifters is usually acceptable even though there is some frequency dependence on the resultant phase shift. Such frequency dependence is much less than that of the time shifter in which the shift is directly proportional to frequency, but such dependence is unsatisfactory for critical applications.

The invention is particularly applicable to phase shifting with improved frequency independence of a phase shift and will be described with particular reference thereto. Although it will be appreciated that the invention has broader applications such as in high precision, beam-forming networks, and other digitally controlled phase shifters.

SUMMARY OF THE INVENTION

The present invention contemplates new and improved phase shifters which overcome all of the above reference problems and others and provides a primarily frequency independent phase shifter.

In accordance with the present invention there is provided a first path with an input into a delay; a delay output is in turn connected to an input of a quadrature hybrid. An isolated port of the quadrature hybrid forms an output of the first path. A second path has an input into a second quadrature hybrid with the associated isolated terminal of the second quadrature hybrid forming a second path output. The remaining terminals of the second quadrature hybrid are connected to ground through reactive elements such as capacitors.

In accordance with a more limited aspect of the invention, there is included a means for selectively communicating a phase shifter input to either the first path input or the second path input while at the same time engaging a phase shifter output to either the first path output or the second path output correspondingly.

In accordance with a yet more limited aspect of the invention, the phase shifter includes an electronic switch to selectively communicate the phase shifter input and phase shifter output to the first path or the second path.

In accordance with another aspect of the invention, the first quadrature and the second quadrature have generally equivalent specification and operating characteristics.

In accordance with a more limited aspect of the invention, the delay has a phase/frequency response generally close to a phase/frequency response of the second quadrature hybrid and its associated reactive load.

The principal object of the invention is the provision of a phase shifter with improved frequency independence for the phase shift.

Another object of the invention is the provision of a selectively controllable phase shifter that presents a phase shift angle primarily independent of frequency.

BRIEF DESCRIPTION OF THE DRAWINGS

The invention may take physical form in certain parts and arrangements of parts, a preferred embodiment of which will be described in detail in this specification and illustrated in the accompanying drawings which form a part hereof, and wherein.

DETAILED DESCRIPTION OF THE PREFERRED EMBODIMENT

Figure 2:
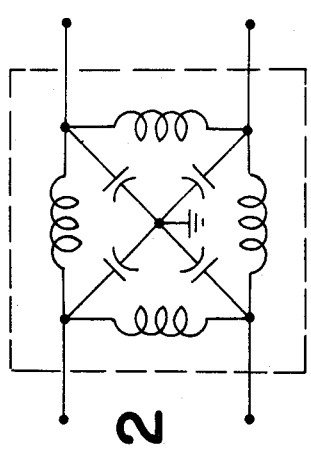
FIG. 2 is a schematic view of a quadrature hybrid circuit that may be employed in the present invention.
Figure 1:
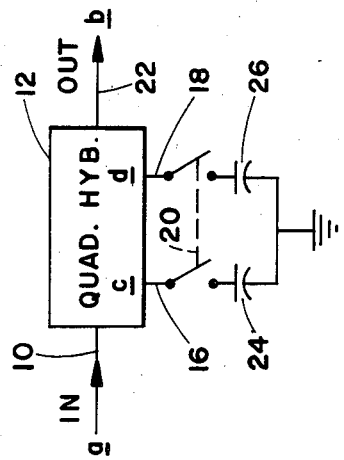
FIG. 1 is a representation of a standard prior art quadrature hybrid phase shifter.

Referring now to the drawings wherein the showings are for the purpose of illustrating the preferred embodiment of the invention only and not for the purpose of limiting the same, FIG. 1 shows a prior art quadrature hybrid based phase shifter (sometimes also referred to as a short-slot hybrid). An improved, asymmetric quadrature hybrid circuit which will function in the present invention is disclosed in Snyder, U.S. Pat. No. 3,869,585 which is incorporated herein. A more simplified symmetrical quadrature hybrid circuit is illustrated by FIG. 2.

To understand the functioning of the present invention, the basic functioning of the quadrature hybrid must first be understood. Hybrids are, generally speaking, specialized 3-dB 4-port couplers which function to divide a signal entering an input port into fixed proportions among the remaining ports. Because hybrids, like couplers, operate by proper phasing of signals, they are virtully lossless. The characteristics of a typical quadrature hybrid are summarized in Table I below:

TABLE 1

| Response at Port (mag./phase) | Input to Port | | | |
|---|---|---|---|---|
| | a | b | c | d |
| a | — | 0 | −3dB/ 0° | −3dB/−90° |
| b | 0 | — | −3dB/ −90° | −3dB/0° |
| c | −3dB/ 0° | −3dB/−90° | — | 0 |
| d | −3dB/ −90° | −3dB/0° | 0 | — |

It will be noted from Table I that for each port of the quadrature hybrid, there is one port where virtually no output is present for an input. This port is referred to as the isolated port. In actuality, the isolated port does show some resultant signals typically in the range of approximately −30 dB in relation to the input signal. With reference to FIG. 1, when an input signal applied at input 10 enters a quadrature hybrid 12, virtually no signal is directly passed to an isolated output 22. However, as noted by Table I, a −3 dB signal with a 0° phase shift will be present at a port 16 and a −3 dB signal with a −90° phase shift will be present at a port 18. When ganged switch 20 is open, as shown in FIG. 1, no output will be present at output terminal 22. When ganged switch 20 is in the closed position, reactive elements 24, 26 will reflect virtually all of the signal thereon, causing almost full output at the output terminal 22. The phase shift at output terminal 22 is a function of the magnitude of reactive elements 24, 26. FIG. 1 depicts reactive elements 24, 26 as capacitors, however, it will be appreciated that inductive elements may be substituted therefor. A desired phase shift magnitude may therefore be chosen by varying the values of reactive elements 24, 26.

The phase shifter of FIG. 1 presents two potential output signals at output terminal 22. Given a preselected input signal, a first phase is present at the output terminal 22 when the ganged switch 20 is in the open position. A second phase is presented when the ganged switch 20 is in the closed position. The magnitude of the difference between the first phase and the second phase is the system phase shift. For the phase shifter of FIG. 1, the system phase shift is typically dependent upon the frequency of the input signal.

Figure 3:
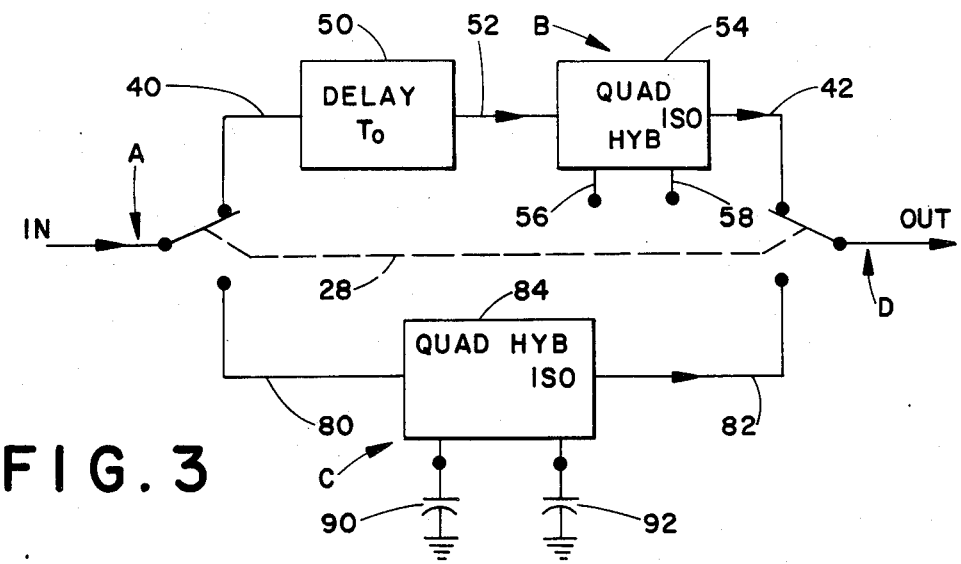
FIG. 3 is a circuit representation of the phase shifter of the present invention.

The improved phase shifter of the present invention is depicted in FIG. 3 which includes a system input A, a first path B and a second path C in parallel to the first path B. Both paths terminate in a system output D. A ganged switch 28 selectively engages the system input A to a first path input 40 while connecting a first path output 42 to the system output D, or alternatively, connects the system input A to a second path input 80 while connecting second path output 82 to system output D. It will be noted that the complete system connection will be from system input A to system output D through either the first path B or the second path C. The ganged switch 28 may be mechanical, electrical, electronic, optical, or by other methods common to the art.

Looking first at the first path B, the first path input 40 forms the input into a delay 50. The delay 50, is a component common to the art which functions to delay the propagation of a periodic wave for a preselected time period T. A delay output 52 forms an input into a first quadrature hybrid 54. The first path output 42 is the terminal isolated from the input 52 to the first quadrature hybrid 54. The remaining first quadrature hybrid non-isolated terminals 56, 58 are left floating or unconnected.

Turning now to the second path C, the second path input 80 forms an input to a second quadrature hybrid 84. The second path output 82 is at the isolated terminal of the second quadrature hybrid to that of the input at 80. The non-isolated terminals of the second quadature hybrid 84 are connected to a common ground through reactive elements 90, 92. As shown, the reactive elements 90, 92 are capacitors. However, it is to be appreciated that inductive elements could also be used. The quadrature hybrid 84 will therefore shift by a phase dictated by the relative magnitudes of the reactive elements 90, 92.

The relative characteristics of the components which comprise the improved phase shifter illustrated by FIG. 3, are preselected to effect a certain phase shift. The first quadrature hybrid 54 is made to be as identical as possible to the second quadrature hybrid 84. The delay 50 has a phase/frequency slope as close as possible to that of the second quadrature hybrid 84 with its reactive elements 90, 92. The operating characteristics of delay 50 are selected such that the slope of its phase vs. frequency curve is generally equal to the phase vs. frequency slope of the second quadrature hybrid 84 with its reactive elements 90, 92.

Figure 4:
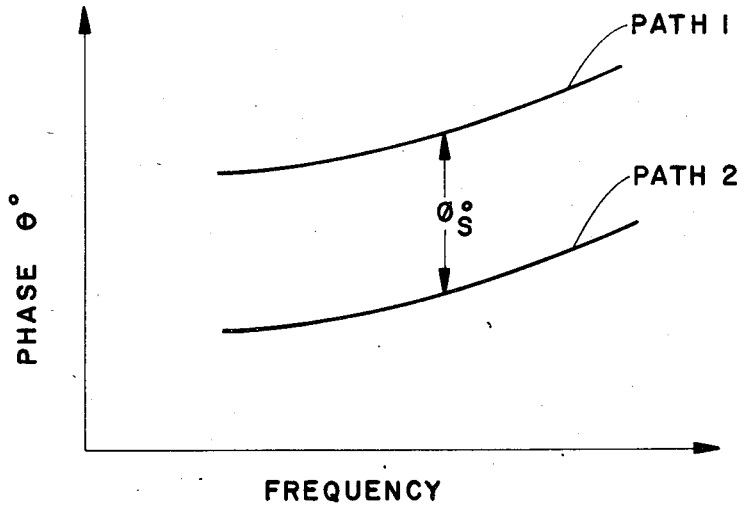
FIG. 4 is a graph of the phase/frequency response between two paths of the circuitry of the present invention.

FIG. 4 illustrates the frequency dependence of the phase angles for the first and second paths. With the relative component values chosen as illustrated above, it will be noted that the phase shift $\phi°_s$ which is determined by the relative values of the reactive elements 90, 92, is generally constant regardless of the path through which the circuit is completed.

Figure 5:
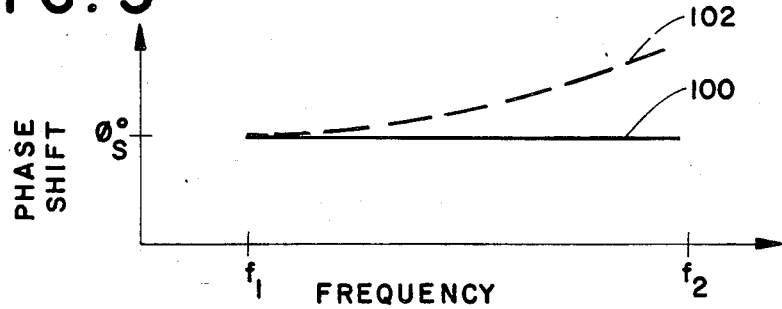
FIG. 5 is a graph of the improved phase shift/frequency curve of a phase shifter of the present invention; and, FIG. 6 is a representation of a cascaded, digitally controllable phase shifter.

Turning now to FIG. 5, it can be seen that the phase shift as a function of frequency as illustrated by curve 100, is relatively constant for the present invention, as compared to the frequency dependence of the prior art shifters illustrated by curve 102. Since the phase shift of the circuit of FIG. 3 is the difference between that of the first path B and the second path C, as the ganged switch 28 is thrown, the frequency dependence of delay 50 will cancel out the frequency dependence of the second quadrature hybrid 84 with reactive elements 90, 92. Similarly, since the first quadrature hybrid 54 is as close as possible to the second quadrature hybrid 84 in its characteristics, the frequency dependence of the first quadrature hybrid 54 will cancel out the frequency dependence of the second quadrature hybrid 84. The desired phase shift $\phi°_s$, introduced by the action of reactive elements 90, 92 coupled with second quadrature hybrid 84, will not cancel out, since there are no reactive elements connected to the first quadrature hybrid 54.

Figure 6:
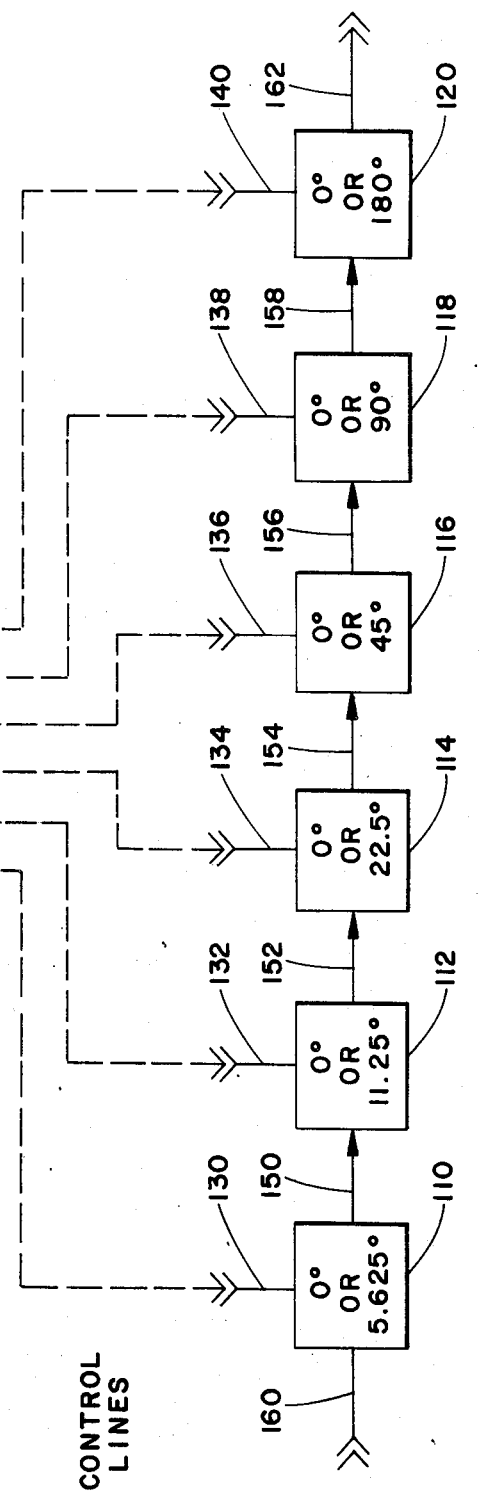

It will be appreciated that switching of the ganged switch 28 may be accomplished by electrical means such as the presence or absence of a control signal which may be digital in nature. Such digital control of phase shifters is well known in the art and attention is drawn to U.S. Pat. No. 3,882,431 wherein such a design is presented. Digital electronic control, when implemented in this fashion, allows for a cascading of electrically controllable phase shifters of discrete phase shift levels, as shown by FIG. 6. In that figure, it will be seen that a plurality of discrete phase shifters 110, 112, 114, 116, 118, and 120 have been cascaded in serial fashion. As illustrated in FIG. 6, six discrete phase shifters have been included, with each being separately controllable by its respective control line 130, 132, 134, 136, 138, and 140. An appropriate control signal on the respective control line actuates the particular phase shifter to which the control line is input. Suitable pulses for controlling the discrete phase shifters may be supplied by an output from an electronic network, microprocessor control, or the like, which is illustrated at 146. The individual phase shifters are cascaded by having their corresponding system input (see A, FIG. 3) interconnected to a system output (B, FIG. 3) of a preceding phase shifter. Signal paths 150, 152, 154, 156 and 158 represent such interconnection. A system input 160 to a variable phase shifter network forms an input to the first phase shift 130. A system output 162 is formed from the output of the last phase shifter.

Six discrete phase shifters are shown, which allow for control of any phase shift between 0 and 360°, selectable in 5.625° increments. Operated in this fashion, a 0° phase shift would have all phase shifters deactivated, a 5.625° phase shift would have only the phase shifter 110 activated, and a 11.25° phase shift would have only the phase shifter 112 activated. Increasing increments of phase shift could thereby be accomplished by selectively activating the discrete phase shifters with activation signals or pulses analogous to binary increments, with 1's representing the ON or activated state. For example, if the control line 130 were to be the 2° column, the control line 132 $2^1$ power column, etc., the binary number input 000000 results in a 0° phase shift the binary number 000101 results in a 28.125° phase shift and the binary input 111111 results in a 354.375° phase shift. In this system, the maximum phase shift is 360° less the size of the increment, or in the example 360°−5.625°.

Though six discrete phase shifters have been shown in the example of FIG. 6, it will be appreciated that N number of phase shifters may be implemented, with phase shift increment accuracy of $360° \div 2^N$. The maximum phase shift in an such network is therefore $360° - (360° \div 2^N)$. Implementing these equations, a two phase shifter system is variable in shift levels of 0°, 90°, 180° or 270°.

When the improved phase shifter of the present invention is cascaded in this manner, the frequency independence of each discrete component prevents the cumulative effect of the discrete phase shifters and the phase shift is generally uniform regardless of the degree of the shift selected on the control lines.

The invention has been described with reference to a preferred embodiment. Obviously, modifications and alterations will occur to others upon a reading and understanding of the specification. It is our intention to include all such modifications and alterations insofar as they come within the scope of the appended claims or the equivalents thereof.

Having thus described our invention, we claim:

1. A phase shifter system comprising:
    a first path including:
    (a) a first path input,
    (b) a delay, with a delay input and a delay output,
    (c) a first quadrature hybrid, with a first input port, a first output port at an isolated port to the input port, and a first non-isolated port to the input port, and
    (d) a first path output, with the first path input, the delay, the first quadrature hybrid, and the first path output being in series electrical connection; and a second path, selectively connectable electrically to, and in parallel with, the first path, the second path including:
    (a) a second path input,
    (b) a second path output, and
    (c) a second quadrature hybrid, with a second input port electrically connected with the second path input, a second output port at an isolated port to the input port electrically connected with the second path output, and a second non-isolated port to the input port; and a reactive load means for determining a system phase shift, the reactive load means being electrically connected to one of the first and second non-isolated ports of the quadrature hybrids.

2. The phase shifter of cliam 1, further comprising means for selectively communicating one of (a) an associated system input terminal to the first path input and an associated system output terminal to the first path output and, (b) the associated system input terminal to the second path input and the associated system output terminal to the second path output; and wherein the reactive load means is electrically connected to the second non-isolated port.

3. The phase shifter of claim 2 wherein the reactive load means includes a capacitor.

4. The phase shifter of claim 2 wherein the means for selectively communicating includes an electronic switch.

5. The phase shifter of claim 2 wherein the first quadrature hybrid and the second quadrature hybrid have generally equivalent characteristics.

6. The phase shifter of claim 5 wherein the delay has a phase/frequency response generally equivalent to a phase/frequency response of the second quadrature hybrid and its associated reactive load means.

7. The phase shifter of claim 6 wherein the selectively communicating means includes an electronic switch.

8. The phase shifter of claim 7 wherein the reactive load means includes a capacitor.

9. The phase shifter of claim 7 wherein the reactive load means includes an inductor.

10. A variable phase shifter comprising:
    first and second phase shifters, each phase shifter including a first path having a delay with a first path input thereto, a first quadrature hybrid with an input port thereof connected to an output of the delay and a first path output at an isolated port to the input port, a second path having a second quadrature hybrid with a second path input thereto and a second path output at an isolated port to the input thereto, reactive load means for defining a system phase shift on a non-isolated port of the second quadrature hybrid;

the first phase shifter having its first path input and its second path input adapted to be electrically connected to an associated variable phase shifter system input; and the second phase shifter adapted to receive signals from the first phase shifter and having its first path output and its second path output adapted to be electrically connected to an associated variable phase shifter system output.

11. The variable phase shifter of claim 10 further comprising at least one intermediate phase shifter adapted to receive the signals from the first phase shifter prior to the second phase shifter.

12. The variable phase shifter of claim 10 further comprising:

a signal path disposed between the first and final phase shifters;

a means for selectively engaging one of (a) the first path input of the first phase shifter to an associated variable phase shifter system input and the first path output of the first phase shifter to the signal path, and (b) the second path input of the first phase shifter to the associated variable phase shifter system input and the second path output of the first phase shifter to the signal path; and, a means for selectively engaging one of (a) the first path input of the second phase shifter to the signal path and the first path output of the second phase shifter to an associated variable phase shifter system output, and (b) the second path output of the second phase shifter to the signal path and the second output of the second phase shifter to the associated variable phase shifter system output.

13. The variable phase shifter of claim 12 wherein the signal path includes at least one phase shifter.

14. The variable phase shifter of claim 13 wherein an aggregate of N phase shifters are implemented and wherein a phase of a signal introduced at the variable phase shifter system input is selectively shiftable in degree increments of $360 \div 2^N$ with a maximum phase shift of $360 - (360 \div 2^N)$.

15. The variable phase shifter of claim 12 wherein the selectively engaging means include electronic switches.

16. The variable phase shifter of claim 15 wherein a phase of a signal introduced into the variable phase shifter system input is selectably shiftable in increments of 0°, 90°, 180° and 270° at the variable phase shifter system output.

17. The variable phase shifter of claim 10 wherein the first quadrature hybrid of each phase shifter has generally equivalent characteristics to the second quadrature hybrid thereof.

18. The variable phase shifter of claim 17 wherein the delay of each phase shifter has a phase/frequency response generally equivalent to a phase/frequency response of the second quadrature hybrid thereof and its associated reactive load means.

19. The variable phase shifter of claim 18 wherein the reactive load means includes a capacitor.

20. The variable phase shifter of claim 18 wherein the reactive load means includes an inductor.

* * * * *